United States Patent
Yang et al.

(10) Patent No.: US 9,653,466 B2
(45) Date of Patent: May 16, 2017

(54) FINFET DEVICE AND METHOD OF MAKING THE SAME

(71) Applicant: QUALCOMM Incorporated, San Diego, CA (US)

(72) Inventors: Haining Yang, San Diego, CA (US); Yanxiang Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/817,441

(22) Filed: Aug. 4, 2015

(65) Prior Publication Data

US 2017/0040324 A1    Feb. 9, 2017

(51) Int. Cl.

| | | |
|---|---|---|
| H01L 27/088 | (2006.01) | |
| H01L 27/092 | (2006.01) | |
| H01L 29/06 | (2006.01) | |
| H01L 21/8238 | (2006.01) | |
| H01L 21/02 | (2006.01) | |
| H01L 21/265 | (2006.01) | |
| H01L 29/66 | (2006.01) | |

(52) U.S. Cl.
CPC .... *H01L 27/0924* (2013.01); *H01L 21/02164* (2013.01); *H01L 21/26513* (2013.01); *H01L 21/823821* (2013.01); *H01L 21/823828* (2013.01); *H01L 21/823892* (2013.01); *H01L 27/0886* (2013.01); *H01L 29/0649* (2013.01); *H01L 29/66545* (2013.01)

(58) Field of Classification Search
CPC ......... H01L 21/823431; H01L 27/0886; H01L 27/1211
See application file for complete search history.

(56) References Cited

U.S. PATENT DOCUMENTS

| | | |
|---|---|---|
| 7,795,669 B2 | 9/2010 | Georgakos et al. |
| 8,603,893 B1 | 12/2013 | Wei et al. |
| 2008/0251849 A1 | 10/2008 | Yamagami et al. |
| 2013/0277760 A1 | 10/2013 | Lu et al. |
| 2014/0001564 A1 | 1/2014 | Song et al. |
| 2014/0077303 A1 | 3/2014 | Baek |
| 2014/0145247 A1 | 5/2014 | Cheng et al. |
| 2014/0151801 A1 | 6/2014 | Haran et al. |
| 2014/0291770 A1 | 10/2014 | Yin et al. |

(Continued)

OTHER PUBLICATIONS

International Search Report and Written Opinion—PCT/US2016/045117—ISA/EPO—Oct. 10, 2016.

*Primary Examiner* — Jae Lee
(74) *Attorney, Agent, or Firm* — Muncy, Geissler, Olds & Lowe, P.C.

(57) ABSTRACT

A finFET device according to some examples herein may include an active gate element above an active fin element and a dummy fin element that partially breaks the active gate element. In another example, a dummy gate element adjacent to an active gate element contains a dummy fin element that partially breaks the dummy gate element. In another example, a first dummy fin element partially breaks an active gate element and a second dummy fin element partially breaks a dummy gate element. In another example, the dummy fin element is of the same material as the active fin element. In another example, the dummy fin element partially breaks a gate element but does not extend to the substrate like the active fin element.

24 Claims, 9 Drawing Sheets

(56) References Cited

U.S. PATENT DOCUMENTS

2015/0076569 A1 3/2015 Hong et al.
2015/0357462 A1* 12/2015 Ponoth .............. H01L 29/66681
  257/329
2016/0099239 A1 4/2016 Schroeder et al.

* cited by examiner

FINFET DEVICE AND METHOD OF MAKING THE SAME

FIELD OF DISCLOSURE

This disclosure relates generally to tunnel field effect transistor, and more specifically, but not exclusively, to finFETs.

BACKGROUND

CMOS technology has been scaling down in size for 40 years under the guidance of Moore's law. To continue scaling, tunnel field-effect transistors (TFETs) such as fin-FETs, are being used. It has been understood that TFETs have advantages for low-power applications because of its' intrinsic low sub-threshold swing and low off-state leakage. TFETS are further improved by using strained silicon. Strained silicon refers to the application of stress (uniaxial and biaxial stress) in the structure to create changes in the direct gate tunneling current. Decreases/increases in the gate tunneling current for various stresses primarily result from repopulation into a sub-band with a larger/smaller out-of-plane effective mass. Hole tunneling current is found to decrease for biaxial and uniaxial compressive stress and increase for biaxial tensile stress. For p-type finFETs, the gate tunneling current increases for biaxial tensile stress but decreases for biaxial and longitudinal compressive stresses. For n-type finFETS, the opposite occurs. FinFET devices are being adopted for advanced CMOS technology nodes such as 22 nm, 14/16 nm, and future 10 nm and 7 nm node, for improved drivability and short channel effect. However, traditional strain enhancement such as embedded SiGe (for p-channel metal-oxide-semiconductor—"PMOS") has shown reduced effectiveness due to smaller SiGe volume from scaled fin source and drain regions.

Accordingly, there is a need for systems, apparatus, and methods that improve upon conventional strain enhancement approaches including the improved methods, system and apparatus provided hereby. The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for a finFET device, including: an active gate element; a first dummy gate element extending parallel to the active gate element, proximate to a first edge of the active gate element; a second dummy gate element extending parallel to the active gate element proximate to a second edge opposite the first edge of the active gate element; a first active fin element extending perpendicular to and vertically below the active gate element, the first dummy gate element, and the second dummy gate element; a second active fin element extending parallel to the first active fin element and horizontally spaced therefrom; and a first dummy fin element between the first active fin element and the second active fin element, the first dummy fin element extending perpendicular to and vertically below the active gate element and partially surrounded by the active gate element.

Some examples of the disclosure are directed to systems, apparatus, and methods for a finFET device, including: an active gate element; a first dummy gate element extending parallel to the active gate element, proximate to a first edge of the active gate element; a second dummy gate element extending parallel to the active gate element proximate to a second edge opposite the first edge of the active gate element; a first active fin element extending perpendicular to and vertically below the active gate element, the first dummy gate element, and the second dummy gate element; a second active fin element extending parallel to the first active fin element and horizontally spaced therefrom; a first dummy fin element between the first active fin element and the second active fin element, the first dummy fin element extending perpendicular to and vertically below the first dummy gate element and partially surrounded by the first dummy gate element; and a second dummy fin element between the first active fin element and the second active fin element, the second dummy fin element extending perpendicular to and vertically below the second dummy gate element and partially surrounded by the second dummy gate element.

Some examples of the disclosure are directed to systems, apparatus, and methods for a finFET device, including: a first metal oxide semiconductor (MOS) having an active gate element and an active fin element; a first dummy gate element extending parallel to the active gate element of the first MOS, proximate to a first edge of the active gate element; a second dummy gate element extending parallel to the active gate element of the first MOS device opposite the first dummy gate element proximate to a second edge opposite the first edge of the active gate element; a first dummy fin element, proximate to a first edge of the active fin element, extending perpendicular to and vertically below the active gate element of the first MOS and partially surrounded by the active gate element; a second dummy fin element, proximate to a second edge of the active fin element opposite the first dummy fin element and adjacent the first MOS and extending perpendicular to and vertically below the active gate element of the first MOS and partially surrounded by the active gate element of the first MOS; a second MOS having an active gate element and a fin element; a third dummy fin element extending perpendicular to and vertically below the first dummy gate element and partially surrounded by the first dummy gate element; and a fourth dummy fin element adjacent the second MOS and extending perpendicular to and vertically below the second dummy gate element and partially surrounded by the second dummy gate element.

Some examples of the disclosure are directed to systems, apparatus, and methods for making a finFET device, the method including: patterning a substrate to form an N-well region and a P-well region; forming an N-well in the N-well region and a P-well in the P-well region; patterning the substrate to form a N+ diffusion region and a P+ diffusion region; forming an N+ diffusion well in the N+ diffusion region and a P+ diffusion well in the P+ diffusion region; forming a fin element layer; opening a NFET region in the fin element layer; opening a PFET region in the fin element layer; forming a first active fin element in the fin element layer; forming a second active fin element in the fin element layer; forming a first dummy fin element in the fin element layer; depositing a silicon-oxide film; forming an active gate element on the silicon-oxide film; forming a first dummy gate element on the silicon-oxide film; forming a second dummy gate element on the silicon-oxide film; depositing an oxide film; forming a P source region and a N source region in the oxide film; depositing a dielectric layer; and forming a source contact and a drain contact in the dielectric layer.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the need for improved strain enhancement in finFET devices. Gate stress has a stronger effect in the scaled channel region of a finFET device. By breaking the gate at different distances to the fin, stress/strain is induced in the fin channel region, which will enhance or degrade device performance depending on the device type (NMOS or PMOS) and strain type (tensile or compressive). In one example, a break is made in the gate element at a desired position without completely breaking the gate element so that it maintains conductivity for circuit functionality. In another example, an active gate element is above an active fin element and a dummy fin element that partially breaks the active gate element. In another example, a dummy gate element adjacent to an active gate element contains a dummy fin element that partially breaks the dummy gate element. In another example, a first dummy fin element partially breaks an active gate element and a second dummy fin element partially breaks a dummy gate element. In another example, the dummy fin element is of the same material as the active fin element. In another example, the dummy fin element partially breaks a gate element but does not extend to the substrate like the active fin element.

Figure 1A:
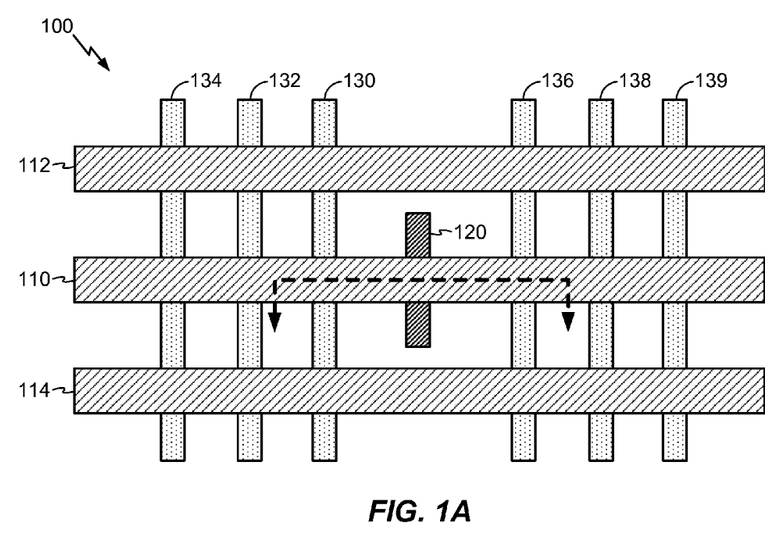
FIGS. 1A and B illustrate a finFET device with a dummy fin element in an active gate element in accordance with some examples of the disclosure.
Figure 1B:
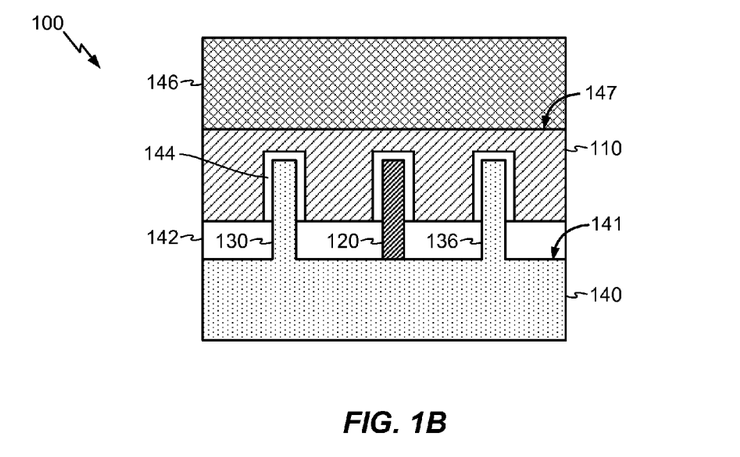

In the following examples, a dummy fin element is shown and described. However, it should be understood that the break (or cut) made in a gate element by the dummy fin element may be made without the use of a dummy fin element, such as an open break. In addition, the following examples use the term active and dummy where active is intended to signify that the element is part of an active (working) transistor and dummy is intended to signify that the element is part of an inactive (non-working) transistor. FIGS. 1A and B illustrate a finFET device with a dummy fin element in an active gate element in accordance with some examples of the disclosure. As shown in the top down view of FIG. 1A, a finFET device 100 may include an active gate element 110 extending horizontally from left to right, a first dummy gate element 112 extending in parallel and spaced from the active gate element 110, and a second dummy gate element 114 extending in parallel and spaced from the active gate element 110 on an opposite side of the active gate element 110 from the first dummy gate element 112. It should be understood that although two dummy gate elements are shown, there may be more than two.

The finFET device 100 may include a first dummy fin element 120 under and perpendicular to the active gate element 110 that extends to both sides of the active gate element 110 towards the first dummy gate element 112 and the second dummy gate element 114; a first active fin element 130 adjacent to and spaced from the first dummy fin element 120 that extends parallel to the first dummy fin element 120 under the active gate element 110, the first dummy gate element 112, and the second dummy gate element 114; a second active fin element 132 adjacent to and spaced from the first active fin element 130 that extends parallel to the first active fin element 130 under the active gate element 110, the first dummy gate element 112, and the second dummy gate element 114; a third active fin element 134 adjacent to and spaced from the second active fin element 132 that extends parallel to the second active fin element 132 under the active gate element 110, the first dummy gate element 112, and the second dummy gate element 114; a fourth active fin element 136 adjacent to and spaced from the first active fin element 130 opposite the first active fin element 130 that extends parallel to the first active fin element 130 under the active gate element 110, the first dummy gate element 112, and the second dummy gate element 114; a fifth active fin element 138 adjacent to and spaced from the fourth active fin element 136 that extends parallel to the fourth active fin element 136 under the active gate element 110, the first dummy gate element 112, and the second dummy gate element 114; and a sixth active fin element 139 adjacent to and spaced from the fifth active fin element 138 that extends parallel to the fifth active fin element 138 under the active gate element 110, the first dummy gate element 112, and the second dummy gate element 114.

As shown in the partial side view of FIG. 1B along the cut lines indicated in FIG. 1A, the finFET device 100 may include a substrate 140, an isolation layer 142 on a first side 141 of the substrate 140, the first dummy fin element 120 extending from the first side 141 of the substrate 140 through the isolation layer 142 and partially into the active gate element 110, the first active fin element 130 extending from the first side 141 of the substrate 140 through the isolation layer 142 and partially into the active gate element 110, the fourth active fin element 136, a gate isolation layer 144 surrounding the portions of the first dummy fin element 120, the first active fin element 130, and the fourth active fin element 136 within the active gate element 110, and a interlayer dielectric layer 146 on a first surface 147 of the active gate element 110. The width of the first dummy fin element 120, the active fin elements 130, 132, 134, 136, 138 and 139 may be approximately 10 nm wide. The height of the first dummy fin element 120, the active fin elements 130, 132, 134, 136, 138 and 139 may be approximately 30-50 nm high. The isolation layer 142 and the gate isolation layer 144 may be composed of oxide, nitride, or other non-conductive material.

The first dummy fin element 120 creates an additional break in the active gate element 110 that releases the compressive stress in the active gate element 110. By releasing the compressive stress in the active gate element 110, the drain saturation current may be changed. For example, in a finFET configured as a p-channel metal-oxide-semiconductor (PMOS) transistor, the stress release may cause the drain saturation current to decrease by up to approximately 45%. In a finFET configured as an n-channel metal-oxide-semiconductor (NMOS) transistor, the stress release may cause the drain saturation current to increase by up to approximately 55%. The increase or decrease in the drain saturation current is caused by the increase in the flow of holes (or electrons depending on the carrier for the particular transistor) in the active fin elements (fin channel region between the source and drain regions to either side of the gate element) resulting from the release of stress in the active gate element. Thus, the first dummy fin element 120 in the active gate element 110 enhances a PMOS configured finFET while degrading an NMOS configured finFET.

Figure 2A:
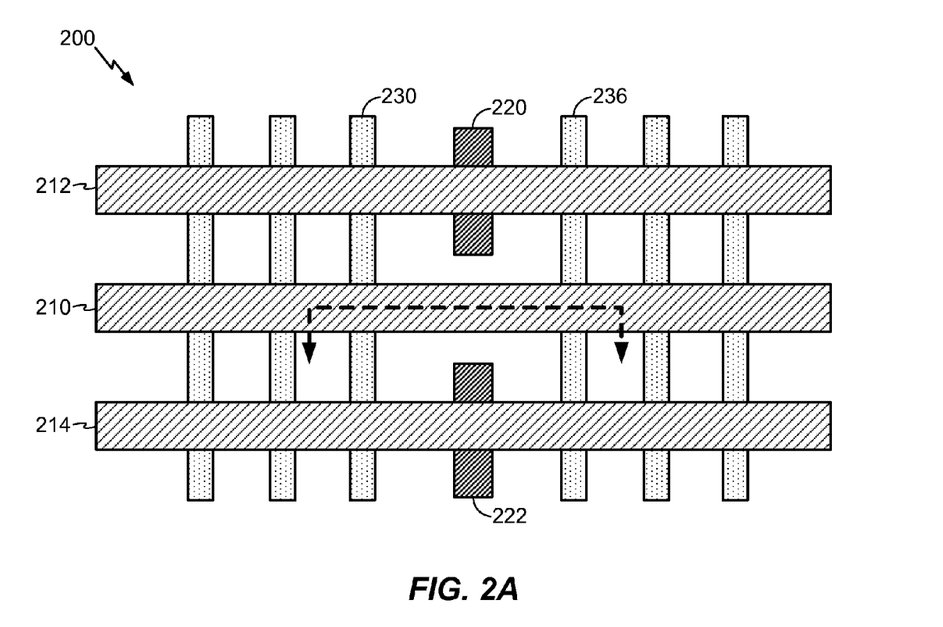
FIGS. 2A and B illustrate a finFET device with a first dummy fin element in a first dummy gate element and a second dummy fin element in a second dummy gate element in accordance with some examples of the disclosure.
Figure 2B:
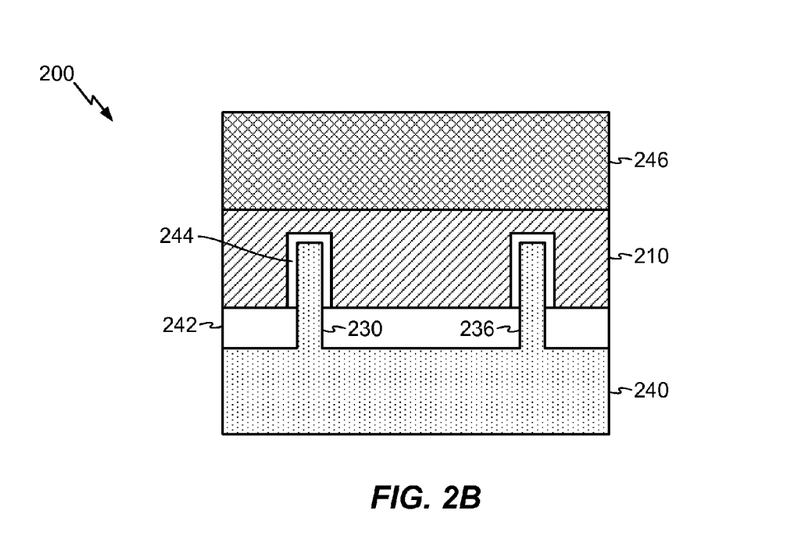

FIGS. 2A and B illustrate a finFET device with a first dummy fin element in a first dummy gate element and a second dummy fin element in a second dummy gate element in accordance with some examples of the disclosure. As shown in the top down view of FIG. 2A, a finFET device 200 may include an active gate element 210 extending horizontally from left to right, a first dummy gate element 212 extending in parallel and spaced from the active gate element 210, a second dummy gate element 214 extending in parallel and spaced from the active gate element 210 on an opposite side of the active gate element 210 from the first dummy gate element 212. It should be understood that although two dummy gate elements are shown, there may be more than two.

The finFET device 200 may include a first dummy fin element 220 under and perpendicular to the first dummy gate element 212 that extends to both sides of the first dummy gate element 212; a second dummy fin element 222 under and perpendicular to the second dummy gate element 214 that extends to both sides of the second dummy gate element 214, a first active fin element 130 adjacent to and spaced from the first dummy fin element 220 and the second dummy fin element 222 that extends parallel to the first dummy fin element 220 and the second dummy fin element 222; and a fourth active fin element 236 adjacent to and spaced from the first active fin element 230 with the first dummy fin element 220 and the second dummy fin element 222 between the first active fin element 230 and the fourth active fin element 236.

As shown in the partial side view of FIG. 2B along the cut lines indicated in FIG. 2A, the finFET device 200 may include a substrate 240, an isolation layer 242 on the substrate 240, the first active fin element 230 extending from the substrate 240 through the isolation layer 242 and partially into the active gate element 210, the fourth active fin element 236 extending from the substrate 240 through the isolation layer 242 and partially into the active gate element 210, a gate isolation layer 244 surrounding the portions of the first active fin element 230 and the fourth active fin element 236 within the active gate element 210, and a interlayer dielectric layer 246 on the active gate element 210. While not shown in FIG. 2B, the first dummy fin element 220 and the second dummy fin element 222 extending from the substrate 240 through the isolation layer 242 and partially into the first dummy gate element 212 and the second dummy gate element 214, respectively similar to that shown in FIG. 1B.

The first dummy fin element 220 and the second dummy fin element 222 create an additional break in the first dummy gate element 212 and the second dummy gate element 214, respectively. These breaks release the compressive stress in the first dummy gate element 212 and the second dummy gate element 214, respectively. By releasing the compressive stress in the first dummy gate element 212 and the second dummy gate element 214, mechanical coupling between the active gate element 210 and the dummy gate elements 212 and 214 causes a reduction in the tensile stress of the adjacent active gate element 210. Reducing the tensile stress in the active gate element 210 may change the drain saturation current. For example, in a finFET configured as a PMOS transistor, the tensile stress release may cause the drain saturation current to increase. In a finFET configured as an NMOS transistor, the tensile stress release may cause the drain saturation current to decrease. Thus, the dummy fin elements 220 and 222 in the dummy gate elements 212 and 214 enhance an NMOS configured finFET while degrading a PMOS configured finFET.

Figure 3A:
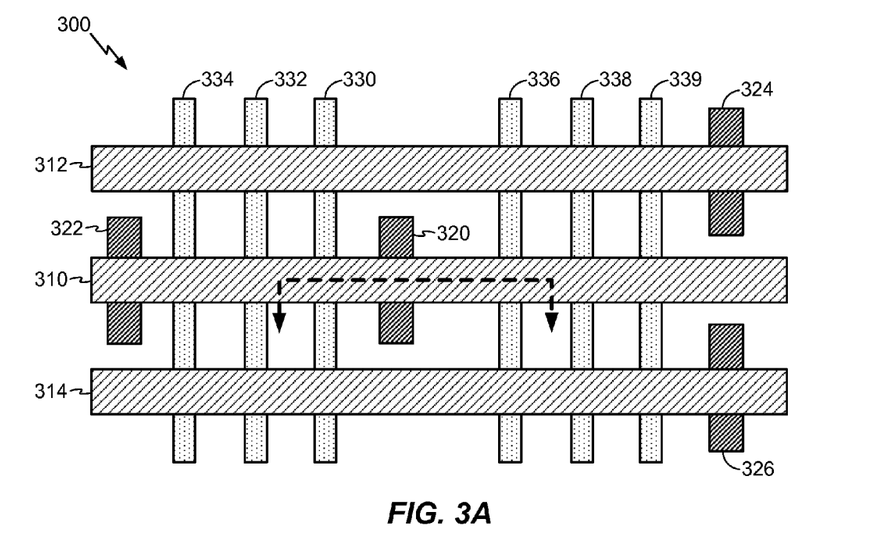
FIGS. 3A and B illustrate a finFET device with a first dummy fin element and a second dummy fin element in an active gate element, a third dummy fin element in a first dummy gate element, and a fourth dummy fin element in a second dummy gate element in accordance with some examples of the disclosure.
Figure 3B:
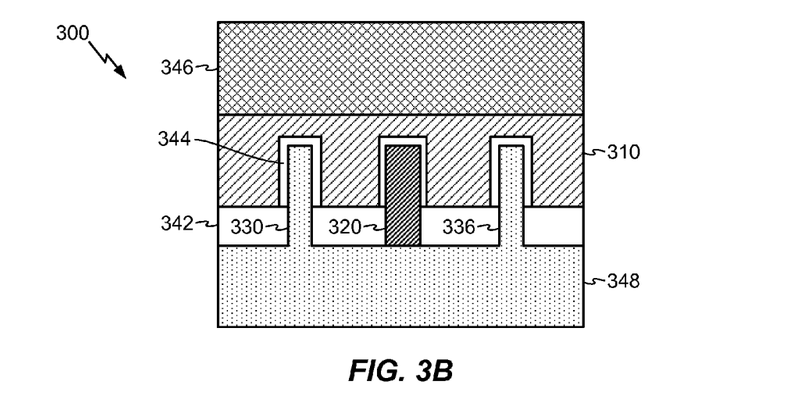

FIGS. 3A and B illustrate a finFET device with a first dummy fin element and a second dummy fin element in an active gate element, a third dummy fin element in a first dummy gate element, and a fourth dummy fin element in a second dummy gate element in accordance with some examples of the disclosure. As shown in the top down view of FIG. 3A, a finFET device 300 may include an active gate element 310 extending horizontally from left to right, a first dummy gate element 312 extending in parallel and spaced from the active gate element 310, a second dummy gate element 314 extending in parallel and spaced from the active gate element 310 on an opposite side of the active gate element 310 from the first dummy gate element 312. It should be understood that although two dummy gate elements are shown, there may be more than two.

The finFET device 300 may include a first active fin element 330 extending perpendicular to and under the active gate element 310, the first dummy gate element 312, and the second dummy gate element 314; a second active fin element 332 adjacent to and spaced from the first active fin element 230 that extends parallel to the first active fin element 330 under the active gate element 310, the first dummy gate element 312, and the second dummy gate element 314; a third active fin element 334 adjacent to and spaced from the second active fin element 332 that extends parallel to the second active fin element 332 under the active gate element 310, the first dummy gate element 312, and the second dummy gate element 314; a fourth active fin element 336 adjacent to and spaced from the first active fin element 330 opposite the first active fin element 330 that extends parallel to the first active fin element 330 under the active gate element 310, the first dummy gate element 312, and the second dummy gate element 314; a fifth active fin element 338 adjacent to and spaced from the fourth active fin element 336 that extends parallel to the fourth active fin element 336 under the active gate element 310, the first dummy gate element 312, and the second dummy gate element 314; a sixth active fin element 339 adjacent to and spaced from the fifth active fin element 338 that extends parallel to the fifth active fin element 338 under the active gate element 310, the first dummy gate element 312, and the second dummy gate element 314.

The finFET device 300 may include a first dummy fin element 320 under and perpendicular to the active gate element 310 between the first active fin element 330 and the fourth active fin element 336; a second dummy fin element 322 under and perpendicular to the active gate element 310 adjacent to the third active fin element 334 on an opposite side from the second active fin element 332; a third dummy fin element 324 under and perpendicular to the first dummy gate element 312 adjacent to the sixth active fin element 339 on an opposite side from the fifth active fin element 338; and a fourth dummy fin element 326 under and perpendicular to the second dummy gate element 314 adjacent to the sixth active fin element 339 on an opposite side from the fifth active fin element 338.

As shown in the partial side view of FIG. 3B along the cut lines indicated in FIG. 3A, the finFET device 300 may include a substrate 340, an isolation layer 342 on the substrate 340, the first dummy fin element 320 extending from the substrate 340 through the isolation layer 342 and partially into the active gate element 310, the first active fin element 330 extending from the substrate 340 through the isolation layer 342 and partially into the active gate element 310, the fourth active fin element 336 extending from the substrate 340 through the isolation layer 342 and partially into the active gate element 310, a gate isolation layer 344 surrounding the portions of the first dummy fin element 320, the first active fin element 330, and the fourth active fin element 336 within the active gate element 310, and a interlayer dielectric layer 346 on the active gate element 310. While not shown in FIG. 2B, the second dummy fin element 322, the third dummy fin element 324, and the fourth dummy fin element 326 extend from the substrate 340 through the isolation layer 342 and partially into the active gate element 310, the first dummy gate element 312, and the second dummy gate element 314, respectively similar to that shown in FIG. 3B.

For the finFET device 300, the active gate element 310 over the fourth active fin element 336, the fifth active fin element 338, and the sixth active fin element 339 may be configured as an NMOS transistor device while the active gate element 310 over the first active fin element 330, the second active fin element 332, and the third active fin element 334 may be configured as a PMOS transistor device. Thus, the finFET device 300 may contain both an enhanced PMOS device and an enhanced NMOS device in the same structure. It should be noted that the first dummy fin element 320 is closer to the first active fin element 330 than the fourth active fin element 336. This way, the effect of the first dummy fin element 320 enhances the PMOS device on the left without substantially degrading the performing of the NMOS device on the right. Alternatively, the PMOS device and the NMOS device may be a type 1 device or a type 2 device.

Figure 4A:
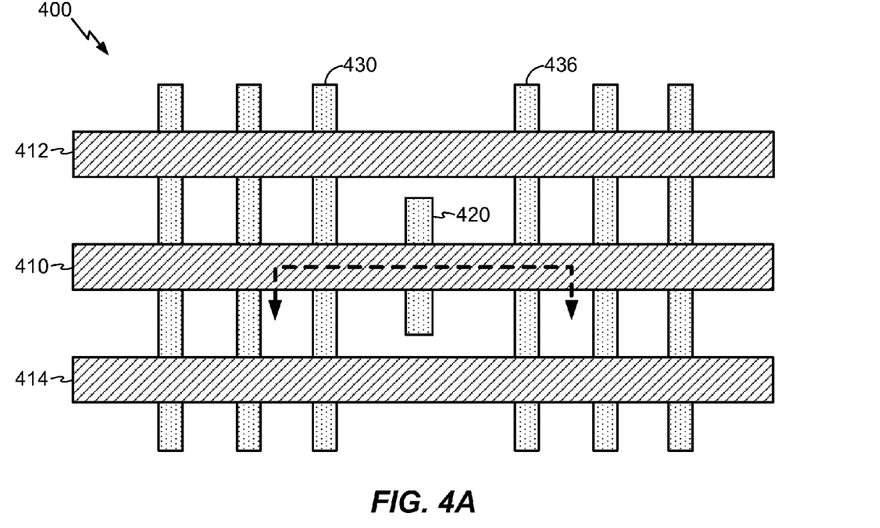
FIGS. 4A and B illustrate a finFET device with a dummy fin composed of the same material as the active fins in accordance with some examples of the disclosure.
Figure 4B:
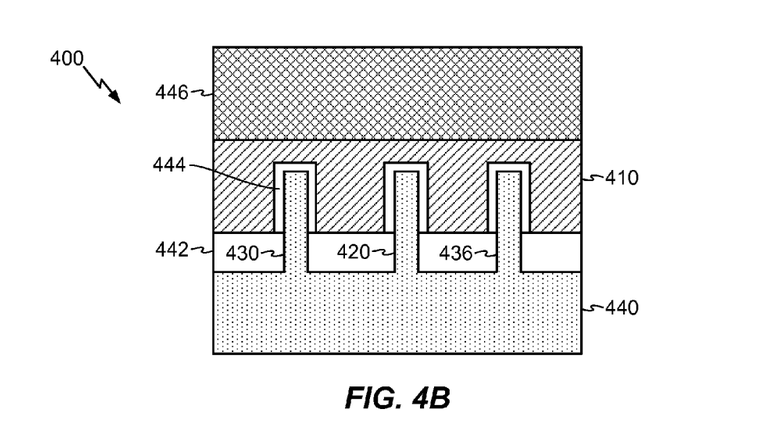

FIGS. 4A and B illustrate a finFET device with a dummy fin composed of the same material as the active fins in accordance with some examples of the disclosure. As shown in the top down view of FIG. 4A, a finFET device 400 may include an active gate element 410 extending horizontally from left to right, a first dummy gate element 412 extending in parallel and spaced from the active gate element 410, a second dummy gate element 414 extending in parallel and spaced from the active gate element 410 on an opposite side of the active gate element 410 from the first dummy gate element 412, a first active fin element 430 extending perpendicular to and under the active gate element 410, a fourth active fin element 436 adjacent to and spaced from the first active fin element 430 that extends parallel to the first active fin element 430 under the active gate element 410, and a first dummy fin element 420 under and perpendicular to the active gate element 410 that extends to both sides of the active gate element 410 towards the first dummy gate element 412 and the second dummy gate element 414.

As shown in the partial side view of FIG. 4B along the cut lines indicated in FIG. 4A, the finFET device 400 may include a substrate 440, an isolation layer 442 on the substrate 440, the first dummy fin element 420 extending from the substrate 440 through the isolation layer 442 and partially into the active gate element 410, a gate isolation layer 444 surrounding the portion of the first dummy fin element 420 within the active gate element 410, and a interlayer dielectric layer 446 on the active gate element 410. The first dummy fin element 420, the first active fin element 430, and the fourth active fin element 436 may be composed of the same conductive material. By having the first dummy fin element 420 composed of the same material as the first and fourth active fin elements 430 and 436 (as well as other active fin elements) allows the dummy fin element 420 to be constructed in the same manner and at the same time as the first active fin element 430 and the fourth active fin element 436. This will allow a simplified, more efficient, and cost effective manufacturing process.

Figure 5A:
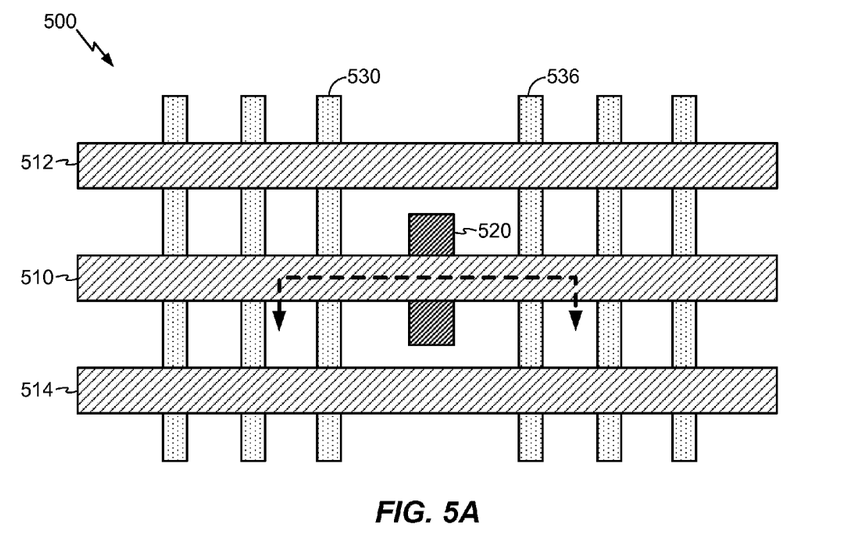
FIGS. 5A and B illustrate a finFET device with an enlarged dummy fin that does not extend to the substrate in accordance with some examples of the disclosure.
Figure 5B:
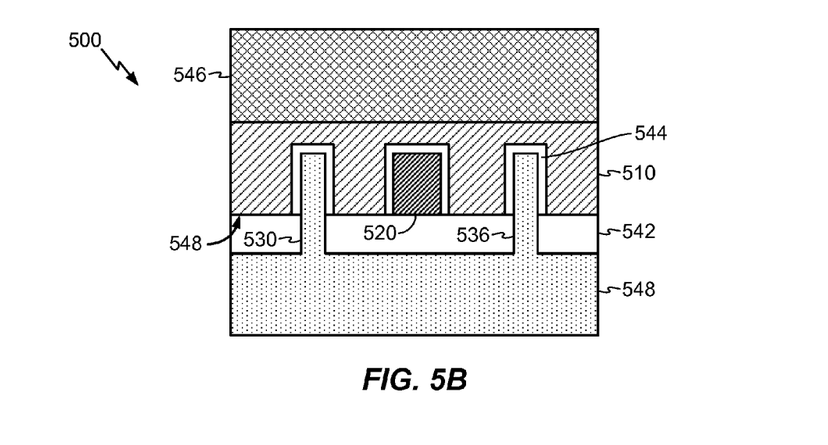

FIGS. 5A and B illustrate a finFET device with an enlarged dummy fin that does not extend to the substrate in accordance with some examples of the disclosure. As shown in the top down view of FIG. 5A, a finFET device 500 may include an active gate element 510 extending horizontally from left to right, a first dummy gate element 512 extending in parallel and spaced from the active gate element 510, a second dummy gate element 514 extending in parallel and spaced from the active gate element 510 on an opposite side of the active gate element 510 from the first dummy gate element 512, a first active fin element 530 extending perpendicular to and under the active gate element 510, a fourth active fin element 536 adjacent to and spaced from the first active fin element 530 that extends parallel to the first active fin element 530 under the active gate element 510, and a first dummy fin element 520 under and perpendicular to the active gate element 510 that extends to both sides of the active gate element 510 towards the first dummy gate element 512 and the second dummy gate element 514.

As shown in the partial side view of FIG. 5B along the cut lines indicated in FIG. 5A, the finFET device 500 may include a substrate 540, an isolation layer 542 on the substrate 540, the first dummy fin element 520 extending from a second surface 548 of the active gate element 510 upward partially into the active gate element 510, the first active fin element 530 and the fourth active fin element 536 extending from the substrate 540 through the isolation layer 542 and partially into the active gate element 510, a gate isolation layer 544 surrounding the portions of the first dummy fin element 520, the first active fin element, and the fourth active fin element 536 within the active gate element 510, and a interlayer dielectric layer 546 on the active gate element 510. The width of the first dummy fin element 520 may be approximately 20 nm wide while the width of the active fin elements 530 and 536 may be approximately 10 nm wide. By having the dummy fin element 420 on top of the isolation layer 542, the manufacture of the finFET device 500 may be easier with less material cost and fewer steps. By increasing the width of the first dummy fin element 520 greater than the active fin elements, the amount of stress relief can be increased without the need to impact the width of the active fin elements that would have an impact on the channel regions of the finFET device 500.

Figure 6A:
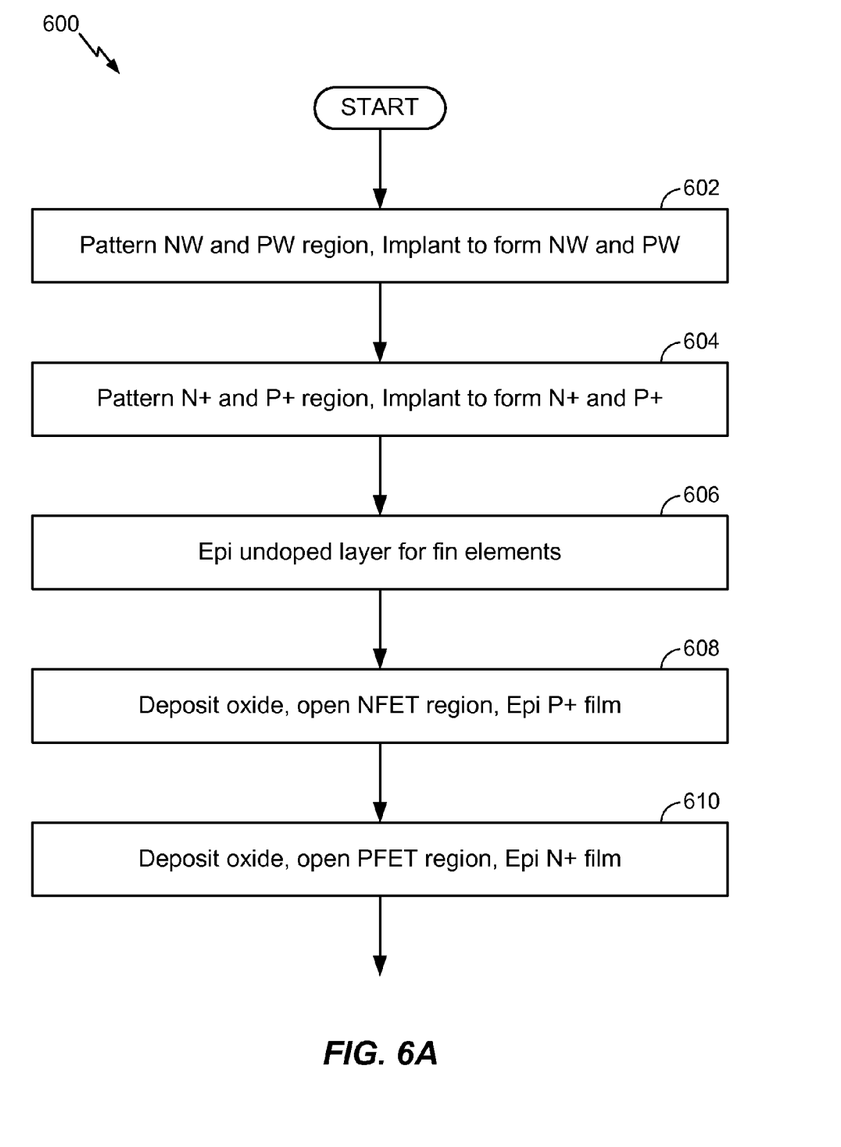
FIGS. 6A-C illustrate an exemplary partial process flow for making a finFET device in accordance with some examples of the disclosure.
Figure 6B:
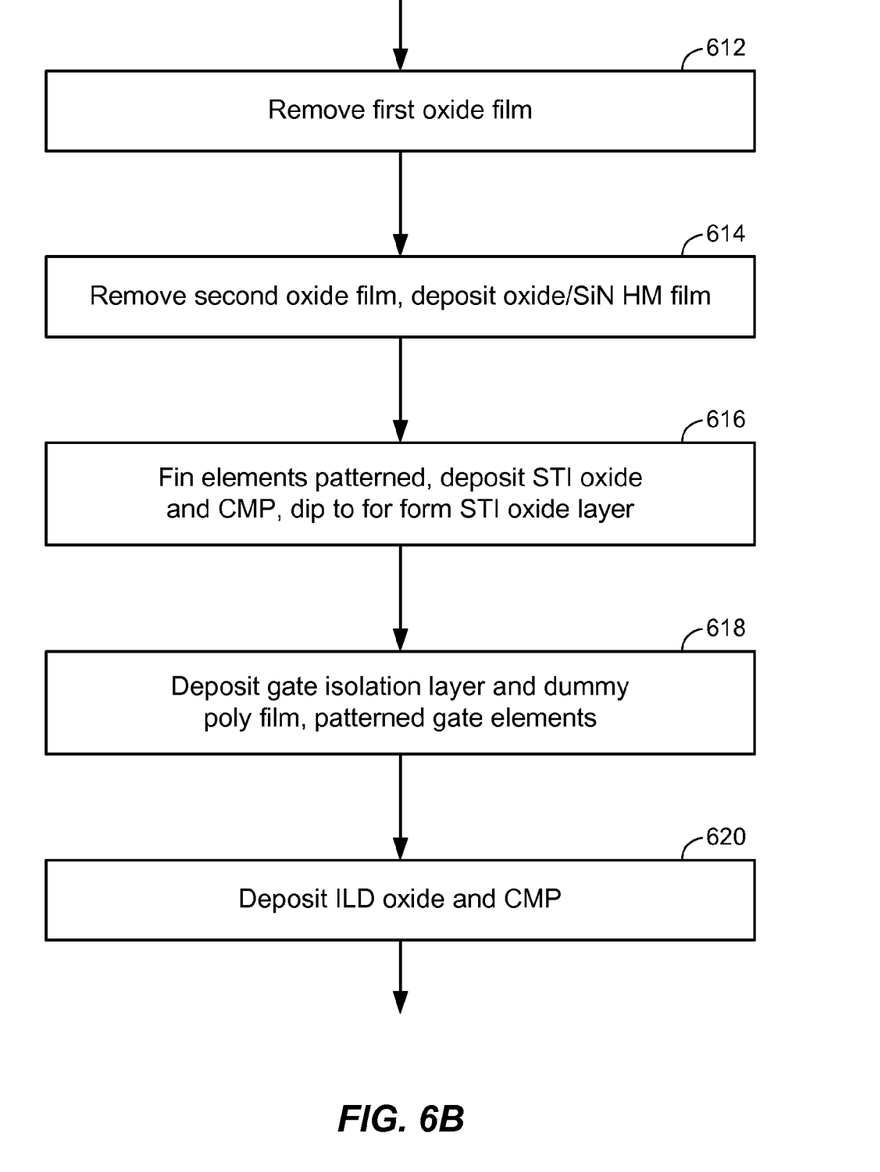
Figure 6C:
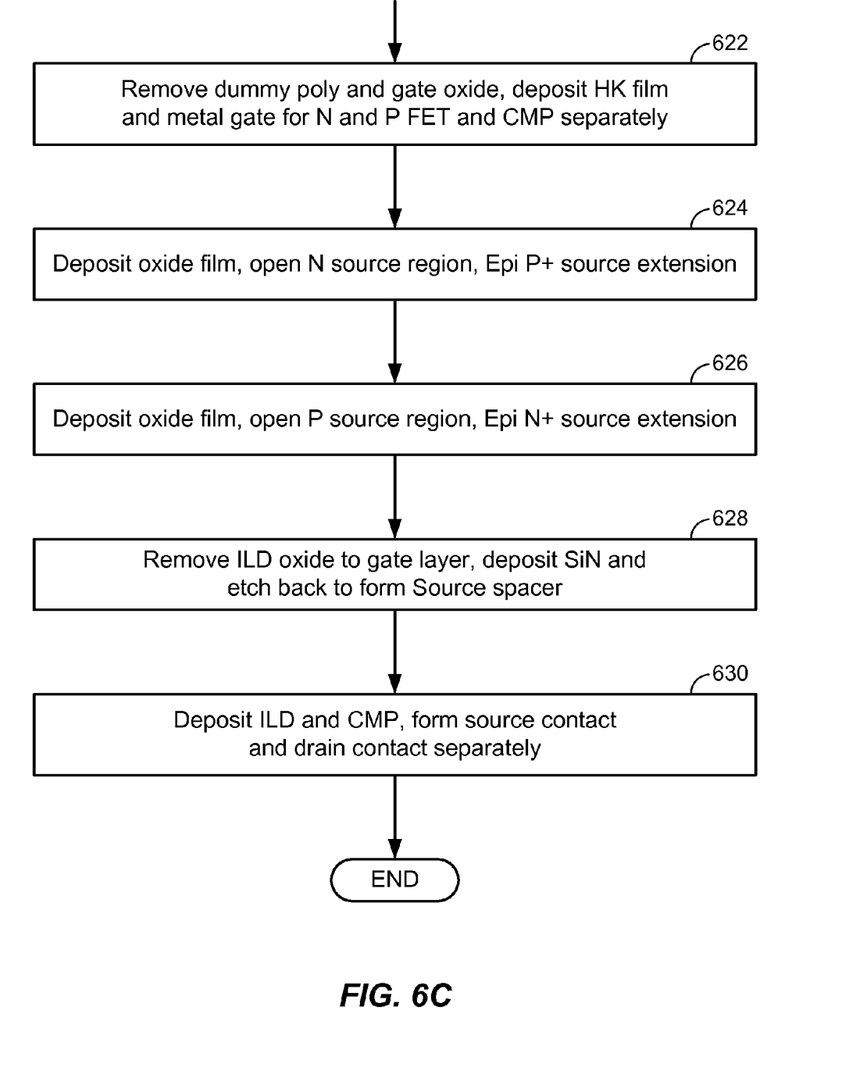

FIGS. 6A-C illustrate an exemplary partial process flow for making a finFET device in accordance with some examples of the disclosure. As shown in FIG. 6A, the partial process flow begins in 602 with patterning the N-well (NW) and P-well (PW) region of a substrate followed by ion implantation to form the NW and PW. Next in 604, the process continues with patterning the N+ diffusion and P+ diffusion region of the substrate followed by ion implantation to form the N+ diffusion well and P+ diffusion well. Next in 606, the channel layer is formed by epixtial (EPI) process to create an EPI undoped layer for fin elements (such as the first dummy fin element 120 and the active fin elements 130, 132, 134, 136, 138, and 139 in FIG. 1A). Next in 608, a first oxide layer is deposited on the channel layer and then a NFET region is opened followed by the application of an EPI P+ film. In 610, a second oxide layer is deposited on the channel layer and then a PFET region is opened followed by the application of an EPI N+ film.

As shown in FIG. 6B, the process continues in 612 with removal of the first oxide film. Next in 614, the second oxide film is removed and an oxide/silicon nitride (SiN) hard mask (HM) film is applied. In 616, a fin element is patterned (such as the first dummy fin element 120 and the active fin elements 130, 132, 134, 136, 138, and 139 in FIG. 1A) then a shallow trench isolation (STI) oxide is applied before a chemical-mechanical planarization (CMP) process followed by dipping the structure to form an STI oxide layer. In 618, a gate isolation layer (such as gate isolation layer 144) is deposited along with a dummy poly gate film and then patterned to form gate elements (such as the active gate element 110, first dummy gate element 112, and second dummy gate element 114 in FIG. 1). In 620, an interlayer dielectric (such as interlayer dielectric layer 146 in FIG. 1) oxide is applied followed by a CMP process.

As shown in FIG. 6C, the process continues in 622 with the removal of the dummy poly gate film and gate isolation layer, depositing a high-K (HK) film and metal gate for N and PFET, and followed by separate CMP process for the gate elements. In 624, another oxide film is deposited, an N source region is opened, and the EPI P+ source extension is formed. In 626, another oxide film is deposited, a P source region is opened, and the EPI N+ source extension is formed. In 628, the ILD oxide to gate layer is removed, a SiN layer is deposited and then etched back to form a source spacer. In 630, the process concludes with depositing an ILD layer and application of a CMP process followed by the formation of the source contact and the drain contact separately.

In this description, certain terminology is used to describe certain features. The term "mobile device" can describe, and is not limited to, a mobile phone, a mobile communication device, a set top box, a music player, a video player, an entertainment unit, a navigation device, a personal digital assistant (PDA), a fixed location data unit, and a computer, a pager, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 7:
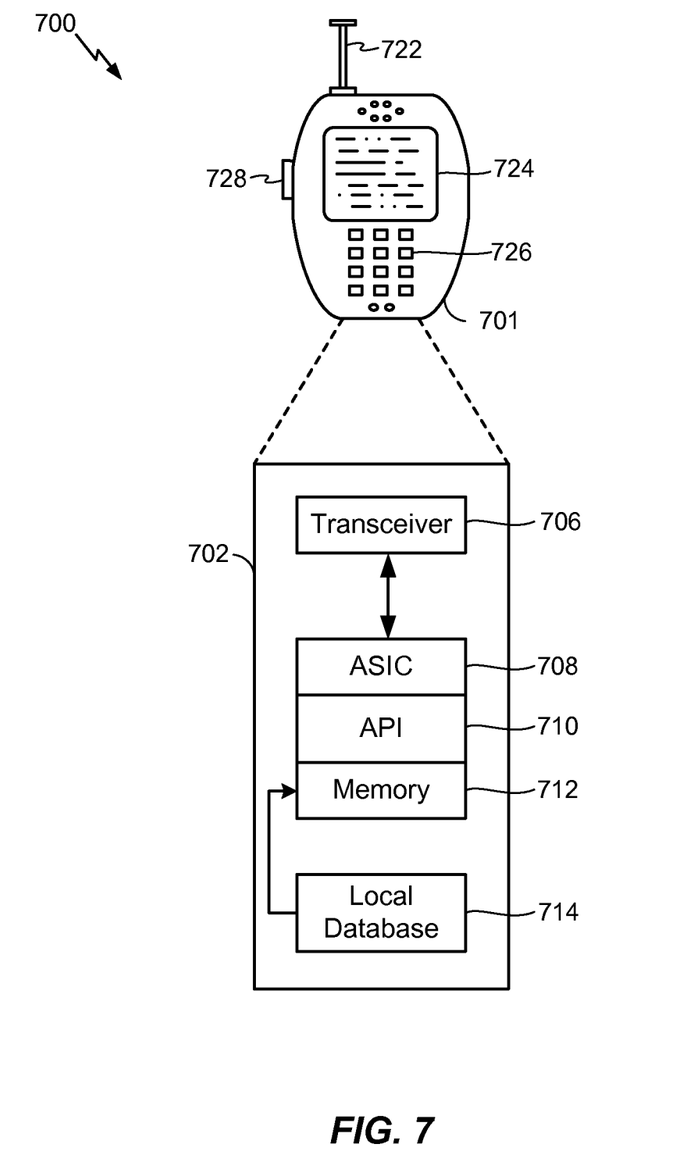
FIG. 7 illustrates exemplary user equipment (UE) in accordance with some examples of the disclosure.

FinFET devices according to the examples above can be used for a number of different transistor applications, such as in the circuit components of a mobile device. Referring to FIG. 7 as an example, a system 700 may include an UE 701, (here a wireless device), which has a platform 702 that can receive and execute software applications, data and/or commands transmitted from a radio access network (RAN) that may ultimately come from a core network, the Internet and/or other remote servers and networks. Platform 702 can include transceiver 706 operably coupled to an application specific integrated circuit ("ASIC" 708), or other processor, microprocessor, logic circuit, or other data processing device. ASIC 708 or other processor executes the application programming interface ("API") 710 layer that interfaces with any resident programs in memory 712 of the wireless device. Memory 712 can be comprised of read-only or random-access memory (RAM and ROM), EEPROM, flash cards, or any memory common to computer platforms. Platform 702 also can include local database 714 that can hold applications not actively used in memory 712. Local database 714 is typically a flash memory cell, but can be any secondary storage device as known in the art, such as magnetic media, EEPROM, optical media, tape, soft or hard disk, or the like. Internal platform 702 components can also be operably coupled to external devices such as antenna 722, display 724, push-to-talk button 728 and keypad 726 among other components, as is known in the art.

The wireless communication between UE 701 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

Nothing stated or illustrated depicted in this application is intended to dedicate any component, step, feature, benefit, advantage, or equivalent to the public, regardless of whether the component, step, feature, benefit, advantage, or the equivalent is recited in the claims.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. It should furthermore be noted that methods disclosed in the description or in the claims can be implemented by a device comprising means for performing the respective steps or actions of this method.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A finFET device, comprising:
an active gate element;
a first dummy gate element extending parallel to the active gate element, proximate to a first edge of the active gate element;
a second dummy gate element extending parallel to the active gate element proximate to a second edge opposite the first edge of the active gate element;
a first active fin element extending perpendicular to and vertically below the active gate element, the first dummy gate element, and the second dummy gate element;
a second active fin element extending parallel to the first active fin element and horizontally spaced therefrom; and
a first dummy fin element between the first active fin element and the second active fin element, the first dummy fin element extending perpendicular to and vertically below the active gate element and partially surrounded by the active gate element.

2. The finFET device of claim 1, wherein the first active fin element is partially surrounded by the active gate element, the first dummy gate element, and the second dummy gate element; and the second active fin element is partially surrounded by the active gate element, the first dummy gate element, and the second dummy gate element.

3. The finFET device of claim 1, wherein the first dummy fin element, the first active fin element, and the second active fin element are composed of a conductive material.

4. The finFET device of claim 1, wherein the first dummy fin element is composed of an insulating material; and wherein the first active fin element and the second active fin element are composed of a conductive material.

5. The finFET device of claim 1, wherein the first dummy fin element has a width different from a width of the first active fin element and the second active fin element.

6. The finFET device of claim 1, further comprising a substrate below the active gate element, the first dummy gate element, and the second dummy gate element, wherein the first dummy fin element extends from the substrate upward into the first dummy gate element.

7. The finFET device of claim 1, wherein the first dummy fin element is closer to the first active fin element than the second active fin element.

8. The finFET device of claim 1, wherein the finFET device is incorporated into a device selected from the group consisting of a set top box, a music player, a video player, an entertainment unit, a navigation device, a communications device, a personal digital assistant (PDA), a fixed location data unit, and a computer.

9. A finFET device, comprising:
an active gate element;
a first dummy gate element extending parallel to the active gate element, proximate to a first edge of the active gate element;
a second dummy gate element extending parallel to the active gate element proximate to a second edge opposite the first edge of the active gate element;

a first active fin element extending perpendicular to and vertically below the active gate element, the first dummy gate element, and the second dummy gate element;

a second active fin element extending parallel to the first active fin element and horizontally spaced therefrom;

a first dummy fin element between the first active fin element and the second active fin element, the first dummy fin element extending perpendicular to and vertically below the first dummy gate element and partially surrounded by the first dummy gate element; and a second dummy fin element between the first active fin element and the second active fin element, the second dummy fin element extending perpendicular to and vertically below the second dummy gate element and partially surrounded by the second dummy gate element.

10. The finFET device of claim 9, wherein the first active fin element is partially surrounded by the active gate element, the first dummy gate element, and the second dummy gate element; and the second active fin element is partially surrounded by the active gate element, the first dummy gate element, and the second dummy gate element.

11. The finFET device of claim 9, wherein the first dummy fin element, the second dummy fin element, the first active fin element, and the second active fin element are composed of a conductive material.

12. The finFET device of claim 9, wherein the first dummy fin element and the second dummy fin element are composed of an insulating material; and wherein the first active fin element and the second active fin element are composed of a conductive material.

13. The finFET device of claim 9, wherein the first dummy fin element and the second dummy fin element have a width different from a width of the first active fin element and the second active fin element.

14. The finFET device of claim 9, further comprising a substrate below the active gate element, the first dummy gate element, and the second dummy gate element, wherein the first dummy fin element and the second dummy fin element extend from the substrate upward into the first dummy gate element and the second dummy gate element respectively.

15. The finFET device of claim 9, wherein the first dummy fin element and the second dummy fin element are closer to the first active fin element than the second active fin element.

16. The finFET device of claim 9, wherein the finFET device is incorporated into a device selected from the group consisting of a set top box, a music player, a video player, an entertainment unit, a navigation device, a communications device, a personal digital assistant (PDA), a fixed location data unit, and a computer.

17. A semiconductor device, comprising:
a first metal oxide semiconductor (MOS) having an active gate element and an active fin element;
a first dummy gate element extending parallel to the active gate element of the first MOS, proximate to a first edge of the active gate element;
a second dummy gate element extending parallel to the active gate element of the first MOS opposite the first dummy gate element proximate to a second edge opposite the first edge of the active gate element;
a first dummy fin element, proximate to a first edge of the active fin element, extending perpendicular to and vertically below the active gate element of the first MOS and partially surrounded by the active gate element;
a second dummy fin element, proximate to a second edge of the active fin element opposite the first dummy fin element and adjacent the first MOS and extending perpendicular to and vertically below the active gate element of the first MOS and partially surrounded by the active gate element of the first MOS;
a second MOS having an active gate element and a fin element;
a third dummy fin element extending perpendicular to and vertically below the first dummy gate element and partially surrounded by the first dummy gate element; and
a fourth dummy fin element adjacent the second MOS and extending perpendicular to and vertically below the second dummy gate element and partially surrounded by the second dummy gate element.

18. The semiconductor device of claim 17, wherein the first MOS is a p-type and the second MOS is an n-type.

19. The semiconductor device of claim 17, wherein the first dummy fin element, the second dummy fin element, the third dummy fin element, and the fourth dummy fin element are composed of a conductive material.

20. The semiconductor device of claim 17, wherein the first dummy fin element, the second dummy fin element, the third dummy fin element, and the fourth dummy fin element are composed of an insulating material.

21. The semiconductor device of claim 17, wherein the first dummy fin element, the second dummy fin element, the third dummy fin element, and the fourth dummy fin element have a width different than a width of the active fin element of the first MOS and a width of the fin element of the second MOS.

22. The semiconductor device of claim 17, further comprising a substrate below the first MOS, the first dummy gate element, and the second dummy gate element; and wherein the first dummy fin element and the second dummy fin element extend from the substrate upward into the active gate element of the first MOS and the third dummy fin element, and the fourth dummy fin element extend from the substrate upward into the first dummy gate element and the second dummy gate element respectively.

23. The semiconductor device of claim 17, wherein the first dummy fin element is closer to the first MOS than the second MOS.

24. The semiconductor device of claim 17, wherein the semiconductor device is incorporated into a device selected from the group consisting of a set top box, a music player, a video player, an entertainment unit, a navigation device, a communications device, a personal digital assistant (PDA), a fixed location data unit, and a computer.

* * * * *